United States Patent
Campbell et al.

(10) Patent No.: US 7,087,919 B2
(45) Date of Patent: Aug. 8, 2006

(54) LAYERED RESISTANCE VARIABLE MEMORY DEVICE AND METHOD OF FABRICATION

(75) Inventors: Kristy A. Campbell, Boise, ID (US); Jiutao Li, Boise, ID (US); Allen McTeer, Eagle, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/819,315

(22) Filed: Apr. 7, 2004

(65) Prior Publication Data

US 2004/0192006 A1    Sep. 30, 2004

Related U.S. Application Data

(63) Continuation-in-part of application No. 10/120,521, filed on Apr. 12, 2002, which is a continuation of application No. 10/077,867, filed on Feb. 20, 2002, now abandoned.

(51) Int. Cl.
    *H01L 45/00* (2006.01)
(52) U.S. Cl. .................. 257/2; 257/E45.002; 257/3; 365/148; 365/163
(58) Field of Classification Search ............... 257/2–5, 257/42, 530, E45.002; 365/163, 159, 148; 438/131, 900
See application file for complete search history.

(56) References Cited

U.S. PATENT DOCUMENTS 3,271,591 A    9/1966    Ovshinsky (Continued)

FOREIGN PATENT DOCUMENTS

JP    56126916    10/1981

(Continued)

OTHER PUBLICATIONS

Abdel-Ali, A.; Elshafie, A.; Elhawary, M.M., DC electric-field effect in bulk and thin-film Ge5As38Te57 chalcogenide glass, Vacuum 59 (2000) 845-853.

(Continued)

*Primary Examiner*—Kenneth Parker
*Assistant Examiner*—Matthew C. Landau
(74) *Attorney, Agent, or Firm*—Dickstein Shapiro Morin & Oshinsky LLP

(57) ABSTRACT

The invention is related to methods and apparatus for providing a resistance variable memory element with improved data retention and switching characteristics. According to one embodiment of the invention, a resistance variable memory element is provided having at least one silver-selenide layer in between two glass layers, wherein at least one of the glass layers is a chalcogenide glass, preferably having a $Ge_xSe_{100-x}$ composition. According to another embodiment of the invention, a resistance variable memory element is provided having at least one silver-selenide layer in between chalcogenide glass layers and further having a silver layer above at least one of said chalcogenide glass layers and a conductive adhesion layer above said silver layer. According to the another embodiment of the invention, a resistance variable memory element is provided having a first chalcogenide glass layer, a silver layer over said chalcogenide glass layer, a second chalcogenide glass layer over said silver layer, a second silver layer over said second chalcogenide glass layer, and a conductive adhesion layer over said a second silver layer.

58 Claims, 14 Drawing Sheets

U.S. PATENT DOCUMENTS

| | | |
|---|---|---|
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| 6,245,663 B1 | 6/2001 | Zhao et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 * | 2/2002 | Moore et al. ............... 438/130 |
| 6,350,679 B1 | 2/2002 | McDaniel et al. |
| 6,368,961 B1 | 4/2002 | Lopatin et al. |
| 6,376,284 B1 | 4/2002 | Gonzalez et al. |
| 6,388,324 B1 | 5/2002 | Kozicki |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Klersy et al. |
| 6,511,862 B1 | 1/2003 | Hudgens et al. |
| 6,511,867 B1 | 1/2003 | Lowrey et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowrey et al. |
| 6,555,860 B1 | 4/2003 | Lowrey et al. |
| 6,563,164 B1 | 5/2003 | Lowrey et al. |
| 6,566,700 B1 | 5/2003 | Xu |
| 6,567,293 B1 | 5/2003 | Lowrey et al. |
| 6,569,705 B1 | 5/2003 | Chiang et al. |
| 6,570,784 B1 | 5/2003 | Lowrey |
| 6,576,921 B1 | 6/2003 | Lowrey |

| | | |
|---|---|---|
| 6,586,761 B1 | 7/2003 | Lowrey |
| 6,589,714 B1 | 7/2003 | Maimon et al. |
| 6,590,807 B1 | 7/2003 | Lowrey |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowrey et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowrey et al. |
| 6,671,710 B1 | 12/2003 | Ovshinsky et al. |
| 6,673,648 B1 | 1/2004 | Lowrey |
| 6,673,700 B1 | 1/2004 | Dennison et al. |
| 6,674,115 B1 | 1/2004 | Hudgens et al. |
| 6,687,153 B1 | 2/2004 | Lowrey |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 6,737,312 B1* | 5/2004 | Moore ................ 438/238 |
| 6,813,178 B1* | 11/2004 | Campbell et al. ........... 365/148 |
| 6,864,521 B1* | 3/2005 | Moore et al. ................ 267/296 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki et al. |
| 2002/0168852 A1 | 11/2002 | Kozicki |
| 2002/0190289 A1 | 12/2002 | Harshfield et al. |
| 2002/0190350 A1* | 12/2002 | Kozicki et al. ............. 257/532 |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0041452 A1* | 3/2003 | Sinha ........................ 29/852 |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1* | 5/2003 | Moore et al. ............... 438/652 |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1* | 8/2003 | Campbell et al. ........... 257/225 |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0026730 A1* | 2/2004 | Kostylev et al. ............. 257/314 |
| 2004/0035401 A1 | 2/2004 | Ramachandran et al. |
| 2004/0043245 A1* | 3/2004 | Moore et al. ................ 428/644 |
| 2004/0202016 A1* | 10/2004 | Campbell .................... 365/159 |
| 2005/0017233 A1* | 1/2005 | Campbell ....................... 257/2 |

FOREIGN PATENT DOCUMENTS

| WO | WO 97/48032 | 12/1997 |
|---|---|---|
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75De25-xSbx, Appl. Phys. A55 (1992) 167-169.

Afifi,M.A.; Labib, H.H.; Fouad, S.S.; El-Shazzly, A.A., Electrical & thermal conductivity of the amorphous semiconductor $Ge_xSe_{1-x}$, Egypt, J. Phys. 17 (1986) 335-342.

Alekperova, Sh.M.; Gadzhieva, G.S., Current-Voltage characteristics of $Ag_2Se$ single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angeil, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Baranovskii, S.D.; Cordes, H., On the conduction mechanism in ionic glasses, J. Chem. Phys. 111(1999) 7546-7557.

Belin, R., Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouate, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Polarized memory switching in MIS thin films, Thin Solid Films 81 (1981) 155-160.

Bernede, J.C., Switching and silver movements in $Ag_2Se$ thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in $Ag_2Se$/Se/M thin film sandwiches. Thin solid films 97 (1982) 165-171.

Bernede, J.C.; Khelil, A., Kettaf, M.; Conan, A., Transition from S- to N-type differential negative resistance in AI-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-72.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin if broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichimetric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen. G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non -Cryst. Solids 220 (1997) 249-253.

Cohen, M.H.; Neale, R.G.; Paskin. A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohnic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution if metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphoous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ; Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of G-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, J.P., On electrical switching and memory effects in amorphous chalcogenides, J. Non-Cryst. Sol. 3 (1970) 148-154.

Haberland, D.R.; Stieger, H., New experiments on the charge-controlled switching effect in amorphous semiconductors, J. Non-Cryst. Solids 8-10 (1972) 408-414.

Haifz, M.M.; Ibrahim, M.M.; Donogol, M.; Hammad, F.H.; Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E. Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analoque memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Hong, K.S.; Speyer, R.F., Switching behavior in II-IV-Vs amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current induced stability in Cr-p+a-Si:H-V thin film devices, Phil. Mag. B 80 (2000) 29-43.

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2Se, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joulie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on amorphous selenium thin fims, Jpn. J. Appl. Phys. 11 (1972) 606.

Mazurier, F.; Levy, M.; Souquet, J.L, Reversible and irreversible electrical switching i nTeO2-V2O5 based glasses, Journal de Physique IV 2 (1992) C2-185-C2-188.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semi-conducting glass diodes, App. Phys. Lett. 14 (1969) 280-282.

Pinto, R.; Ramanathan, K.V., Electric field induced memory switching in thin films of the chalcogenide system, Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.Gage,S.M.;Choi,W.K. ;Snell,A.J.;Owen,A.E., Amorphous silicon analogue memory devices, J. Non-Cryst. Solids 115 (1989) 168-170.

Rose,M.J.;Snell,A.J.;Lecomber, P.G.; Hajto, J.;Fitzgerald,A.G.;Owen,A.E., Aspects of non-volatility in a -Si: H memory devices, Mat. Res. Soc. Symp. Proc. V 258, 1992, 1075-1080.

Schuocker, D.; Rieder, G., On the Reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell,A.J.; Hajto, J.; Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal (??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes, M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov, P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Axon Technologies Corporation, Technology Description: *Programmable Metalization Cell(PMC)*, pp. 1-6 (Pre-May 2000).

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title pg. -114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Huggett et al., *Development of silver sensitized germanium selenide photoresist by reactive* sputter etching in $SF_6$, 42 Appl. Phys. Lett., No. 7, pp. 592-594 (Apr. 1983).

Kawaguchi et al., *Mechanism of photosurface deposition*, 164-166 J. Non-Cryst. Solids, pp. 1231-1234 (1993).

Kolobov and Elliott, Photodoping of Amorphous Chalcogenides by Metals, Advances in Physics, vol. 40, No. 5, 625-684 (1991).

Kozicki, et al., "Applications of Programmable Resistance Changes in Metal-doped Chalcogenides", Proceedings of the 1999 Symposium on Solid State Ionic Devices, Editors-E.D. Wachsman et al., The Electrochemical Society, Inc., 1-12 (1999).

Kozicki, et al., *Nanoscale effects in devices based on chalcogenide solid solutions*, Superlattices and Microstructures, 27, 485-488 (2000).

Kozicki, et al., *Nanoscale phase separation in Ag-Ge-Se glasses*, Microelectronic Engineering, vol. 63/1-3, 155-159 (2002).

M.N. Kozicki and M. Mitkova, *Silver incorporation in thin films of selenium rich Ge-Se glasses*, Proceedings of the XIX International Congress on Glass, Society for Glass Technology, 226-227 (2001).

McHardy et al., *The dissolution of metals in amorphous chalcogenides and the effects o electron and ultraviolet radiation*, 20 J. Phys. C.: Solid State Phys., pp. 4055-4075 (1987)f.

Owen et al., *Metal-Chalcogenide Photoresists for High Resolution Lithography and Sub-Micron Structures*, Nanostructure Physics and Fabrication, pp. 447-451 (M. Reed ed. 1989).

Shimizu et al., *The Photo-Erasable Memory Switching Effect of Ag Photo-Doped Chalcogenide Glasses*, 46 B. Chem Soc Japan, No. 12, pp. 3662-3365. (1973).

Kawamoto et al., Ionic Conduction in As2S3-Ag2S, GeS2-GeS-Ag2S and P2S5-Ag2S Glasses, 20 Journal of Non-Crystalline Solids, pp. 393-404 (1976).

Copy of International Search Report dated Aug. 31, 2005.

\* cited by examiner

LAYERED RESISTANCE VARIABLE MEMORY DEVICE AND METHOD OF FABRICATION

This application is a continuation-in-part of U.S. patent application Ser. No. 10/120,521 filed Apr. 12, 2002, which is a continuation of U.S. patent application Ser. No. 10/077,867 filed Feb. 20, 2002 now abandoned, the contents of both being incorporated herein by reference.

FIELD OF THE INVENTION

The invention relates to the field of random access memory (RAM) devices formed using a resistance variable material.

BACKGROUND

Recently resistance variable memory elements, which include Programmable Conductive Random Access Memory (PCRAM) elements, have been investigated for suitability as semi-volatile and non-volatile random access memory devices. A typical PCRAM device is disclosed in U.S. Pat. No. 6,348,365 to Moore and Gilton. In typical PCRAM devices, conductive material, such as silver, is incorporated into a chalcogenide material. The resistance of the chalcogenide material can be programmed to stable higher resistance and lower resistance states. The unprogrammed PCRAM device is normally in a high resistance state. A write operation programs the PCRAM device to a lower resistance state by applying a voltage potential across the chalcogenide material.

The programmed lower resistance state can remain intact for an indefinite period, typically ranging from hours to weeks, after the voltage potentials are removed. The PCRAM device can be returned to its higher resistance state by applying a reverse voltage potential of about the same order of magnitude as used to write the element to the lower resistance state. Again, the higher resistance state is maintained in a semi-volatile manner once the voltage potential is removed. In this way, such a device can function as a resistance variable memory element having two resistance states, which can define two logic states.

A PCRAM device can incorporate a chalcogenide glass comprising germanium selenide ($Ge_xSe_{100-x}$). The germanium selenide glass may also incorporate silver (Ag) or silver selenide ($Ag_2Se$).

The amorphous nature of the chalcogenide glass material used in a PCRAM device has a direct bearing on its programming characteristics. Thus, incorporation of silver into the chalcogenide glass requires precise control of the glass composition and silver concentration so as not to cause the chalcogenide glass to change from the desired amorphous state to a crystalline state.

Accordingly, there is a need for a resistance variable memory element having improved memory retention and switching characteristics.

BRIEF SUMMARY OF THE INVENTION

The invention provides a resistance variable memory element and a method of forming a resistance variable memory element.

In one embodiment, the invention provides a memory element having at least one layer of silver-selenide between a first chalcogenide glass layer and a conductive adhesive layer. The conductive adhesive layer may also be a chalcogenide glass layer. The stack of layers comprising a first chalcogenide glass layer, a silver-selenide layer, and a second chalcogenide glass layer are formed between two conductive layers or electrodes. In another embodiment of the invention, the stack of layers may contain more than one silver-selenide layer between the chalcogenide glass layer and the conductive adhesion layer. In another embodiment, the memory element may contain layers of chalcogenide glass, layers of silver, and layers of silver-selenide, in various orders, between the electrodes. The invention provides structures for PCRAM devices with improved memory characteristics.

BRIEF DESCRIPTION OF THE DRAWINGS

The above-discussed and other features and advantages of the invention will be better understood from the following detailed description, which is provided in connection with the accompanying drawings.

DETAILED DESCRIPTION OF THE INVENTION

Figure 1:
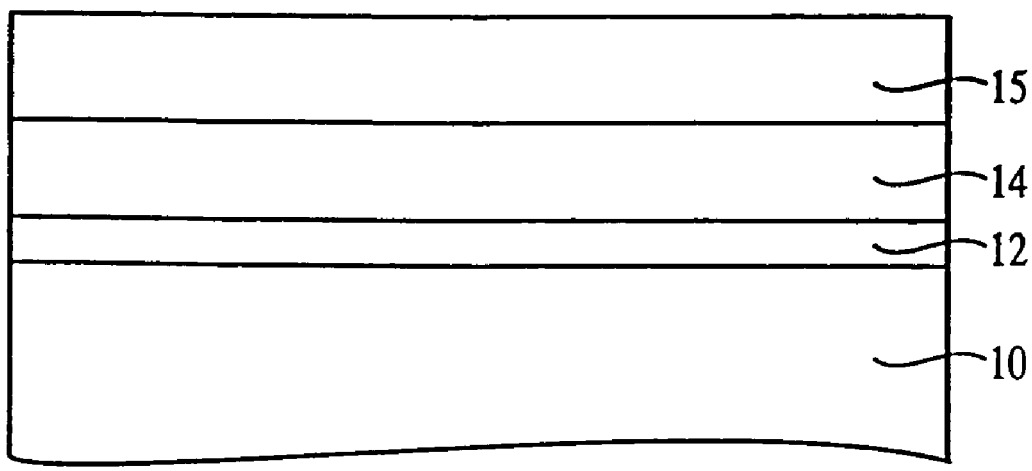
FIGS. 1–7 illustrate cross-sectional views of a memory element fabricated in accordance with an embodiment of the invention and at different stages of processing.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver. For example, silver-selenide species may be represented by the general formula $Ag_{2+/-x}Se$. Though not being limited by a particular stoichiometric ratio between Ag and Se, devices of the present invention typically comprise an $Ag_{2+/-x}Se$ species where x ranges from about 1 to about 0.

The term "semi-volatile memory" is intended to include any memory device or element which is capable of maintaining its memory state after power is removed from the device for some period of time. Thus, semi-volatile memory devices are capable of retaining stored data after the power source is disconnected or removed. Accordingly, the term "semi-volatile memory" is also intended to include not only semi-volatile memory devices, but also non-volatile memory devices and those of low volatility.

The term "resistance variable material" is intended to include chalcogenide glasses, and chalcogenide glasses comprising a metal, such as silver or metal ions. For instance, the term "resistance variable material" may include silver doped chalcogenide glasses, silver-germanium-selenide glasses, chalcogenide glass comprising a silver selenide layer, and non-doped chalcogenide glass.

The term "resistance variable memory element" is intended to include any memory element, including Programmable Conductor Random Access Memory elements, which exhibit a resistance change in response to an applied voltage.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

The invention will now be explained with reference to the figures, which illustrate exemplary embodiments and where like reference numbers indicate like features. FIG. 1 depicts a portion of an optional insulating layer 12 formed over a semiconductor substrate 10, for example, a silicon substrate. It should be understood that the memory elements of the invention can be formed over a variety of substrate materials and not just semiconductor substrates such as silicon, as shown above. For example, the optional insulating layer 12 may be formed on a ceramic or polymer-based substrate. The insulating layer 12 may be formed by any known deposition methods, such as sputtering by chemical vapor deposition (CVD), plasma enhanced CVD (PECVD) or physical vapor deposition (PVD). The insulating layer 12 may be formed of a conventional insulating oxide, such as silicon oxide ($SiO_2$), a silicon nitride ($Si_3N_4$), or a low dielectric constant material, among many others.

A first electrode 14 is formed over the insulating layer 12, as also illustrated in FIG. 1. The first electrode 14 may comprise any conductive material, for example, tungsten, nickel, tantalum, aluminum, platinum, conductive nitrides, and other materials. A second insulating layer 15 is next formed over the first electrode 14. The second insulating layer 15 may comprise the same or different materials as those described above with reference to the insulating layer 12.

Figure 2:
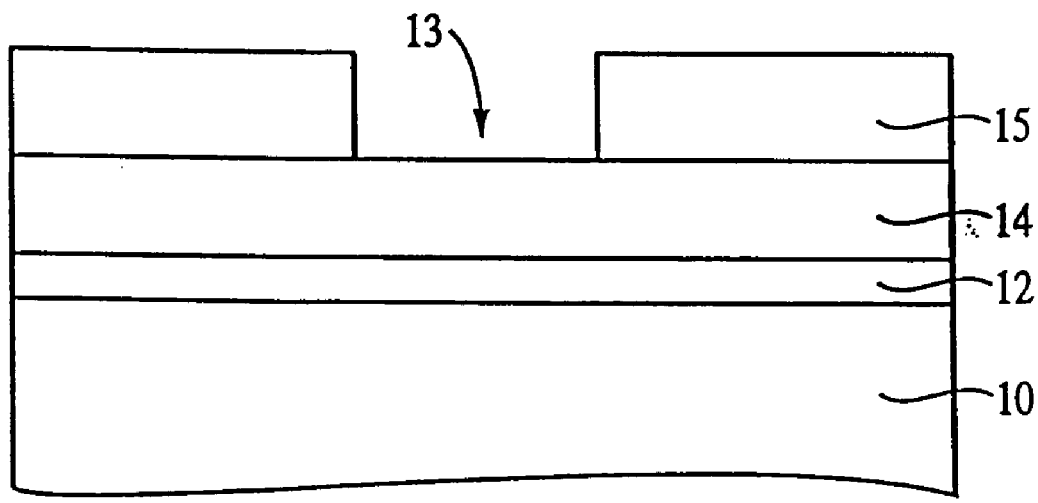
Figure 3:
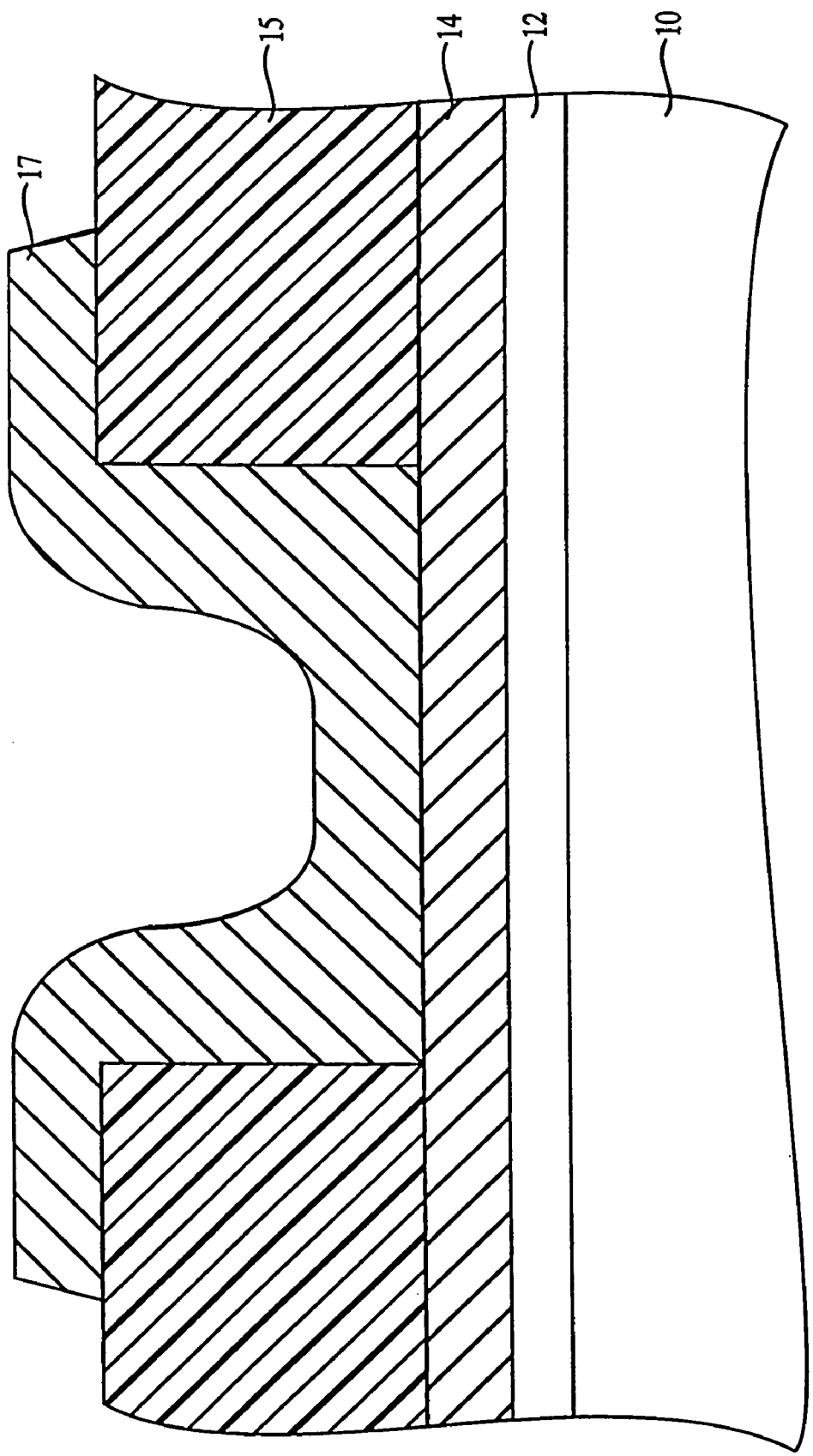

Referring now to FIG. 2, an opening 13 extending to the first electrode 14 is formed in the second insulating layer 15. The opening 13 may be formed by known methods in the art, for example, by a conventional patterning and etching process. A first chalcogenide glass layer 17 is next formed over the second insulating layer 15, to fill in the opening 13, as shown in FIG. 3.

According to an embodiment of the invention, the first chalcogenide glass layer 17 can be germanium-selenide glass having a $Ge_xSe_{100-x}$ stoichiometry. The preferred stoichiometric range is between about $Ge_{20}Se_{80}$ to about $Ge_{43}Se_{57}$ and is more preferably about $Ge_{40}Se_{60}$. The first chalcogenide glass layer 17 preferably has a thickness from about 100 Å to about 1000 Å and is more preferably about 150 Å.

The formation of the first chalcogenide glass layer 17, having a stoichiometric composition in accordance with the invention, may be accomplished by any suitable method. For instance, germanium-selenide glass can be formed by evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry, are examples of methods which may be used.

Figure 4:
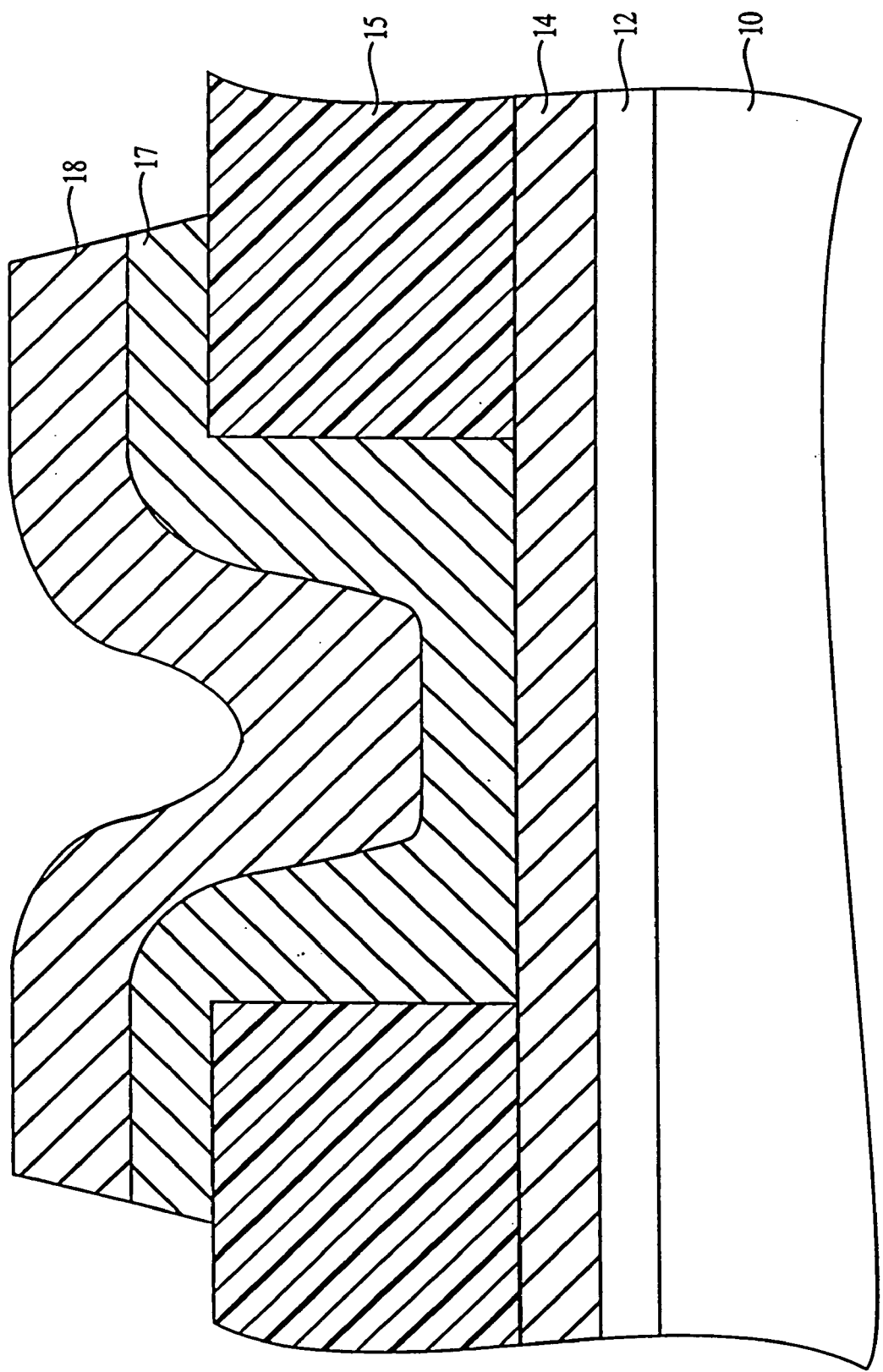

As shown in FIG. 4, metal containing layer 18 may be directly deposited on the surface of the first chalcogenide glass layer, 17. When a metal containing layer 17, such as a silver-selenide layer, is provided in contact with the chalcogenide glass, doping the chalcogenide glass layer 17 by photodoping or thermal diffusion becomes unnecessary. However, doping the chalcogenide glass layer 17 with a metal (e.g. silver) is an optional variant.

The metal containing layer 18 may be any suitable metal containing layer. For instance, suitable metal containing layers include silver-chalcogenide layers, such as silver-sulfide, silver-oxide, silver-telluride, and silver-selenide. A variety of processes can be used to form the preferred metal containing layer 18, which is silver-selenide. For instance, physical vapor deposition techniques such as evaporative deposition and sputtering may be used. Other processes such as chemical vapor deposition, co-evaporation or depositing a layer of selenium above a layer of silver to form a silver-selenide layer can also be used.

Preferably, the thickness of the metal containing layers 17, 18 can be such that a ratio of the metal containing layer 18 to the first chalcogenide glass layer 17 thicknesses is between about 5:1 and about 1:1. In other words, the thickness of the metal containing layer 18 is between about 1 to about 5 times greater than the thickness of the first chalcogenide glass layer 17. Even more preferably, the ratio is between about 3.1:1 and about 2:1.

Figure 5:
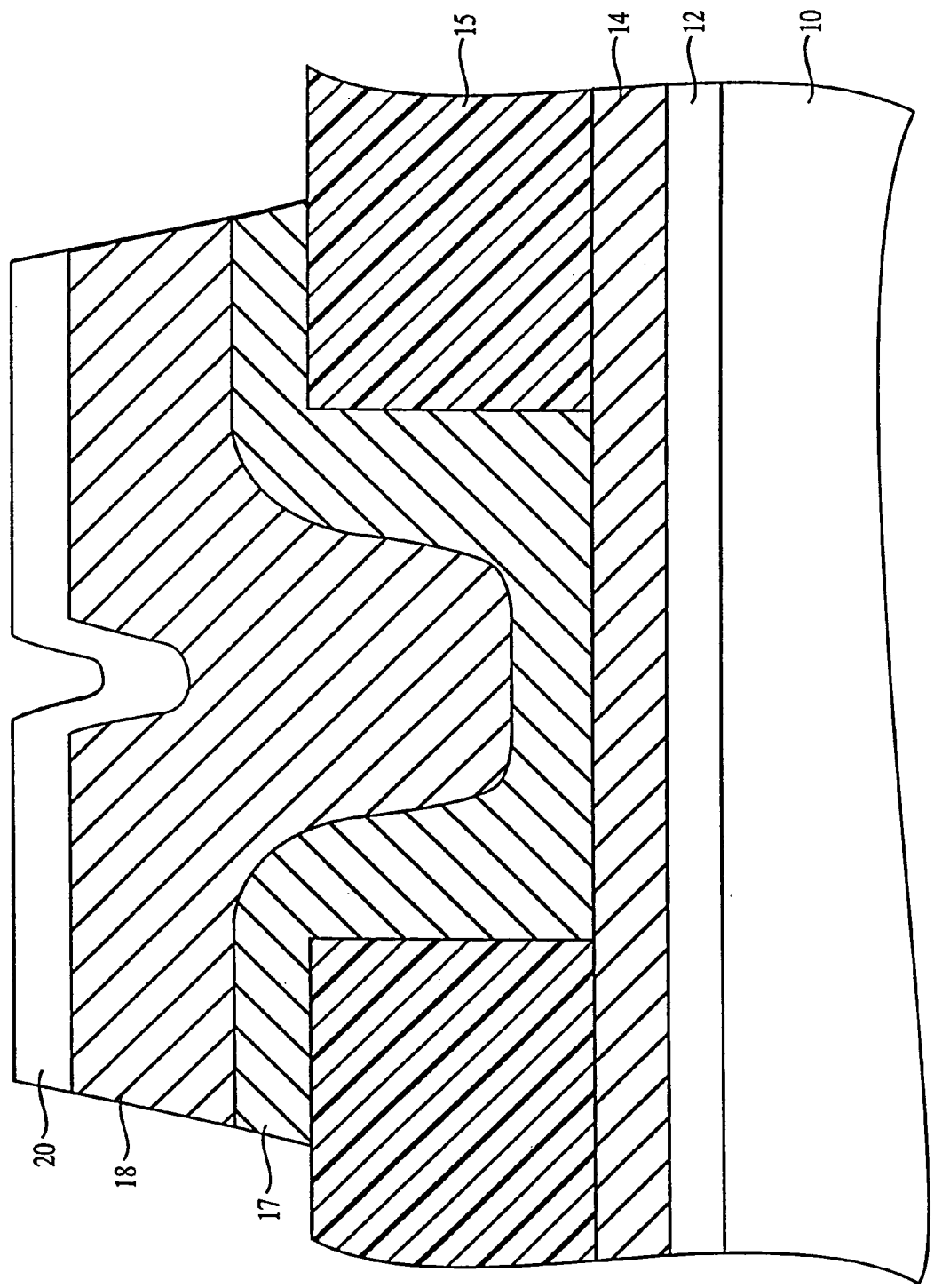

Referring now to FIG. 5, a second glass layer 20 can be formed over the first metal containing layer 18. Where the metal containing layer is silver-selenide, the second glass layer 20 allows deposition of silver above the silver-selenide layer, while preventing agglomeration of silver on the surface of the silver-selenide. The second glass layer 20 may prevent or regulate migration of metal, such as silver, from an electrode 22 (FIG. 6) into the memory element.

The second glass layer 20 may also act as a silver diffusion control layer or an adhesion layer. For use as a diffusion control layer, any suitable glass may be used, including but not limited to chalcogenide glasses. The second chalcogenide glass layer 20 may, but need not, have the same stoichiometric composition as the first chalcogenide glass layer, e.g., $Ge_xSe_{100-x}$. Thus, the second glass layer 20 may be of a different material, different stoichiometry, and/or more rigid than the first chalcogenide glass layer 17. When used as a diffusion control layer, the second glass layer 20 may comprise SiSe (silicon-selenide), AsSe (arsenic-selenide, such as $As_3Se_2$), GeS (germanium-sulfide), and combinations of Ge, Ag, and Se. Any one of these suitable glass materials may further comprise small concentrations, e.g. less than about 3%, of dopants to include nitrides, metal, and other group 13–16 elements from the periodic table.

The thickness of the layers 18, 20 are such that the metal containing layer 18 thickness is greater than the thickness of the second glass layer 20. Preferably, a ratio of the metal containing layer 18 thickness to the second glass layer 20 thickness is between about 5:1 and about 1:1. More preferably, the ratio of the metal containing layer 18 thickness to the thickness of the second glass layer 20 is between about 3.3:1 and about 2:1. The second glass layer 20 preferably has a thickness between about 100 Å to about 1000 Å and is more preferably about 150 Å. The second glass layer 20 may be formed by any suitable method. For example, chemical vapor deposition, evaporation, co-sputtering, or sputtering using a target having the desired stoichiometry, may be used.

Figure 6:
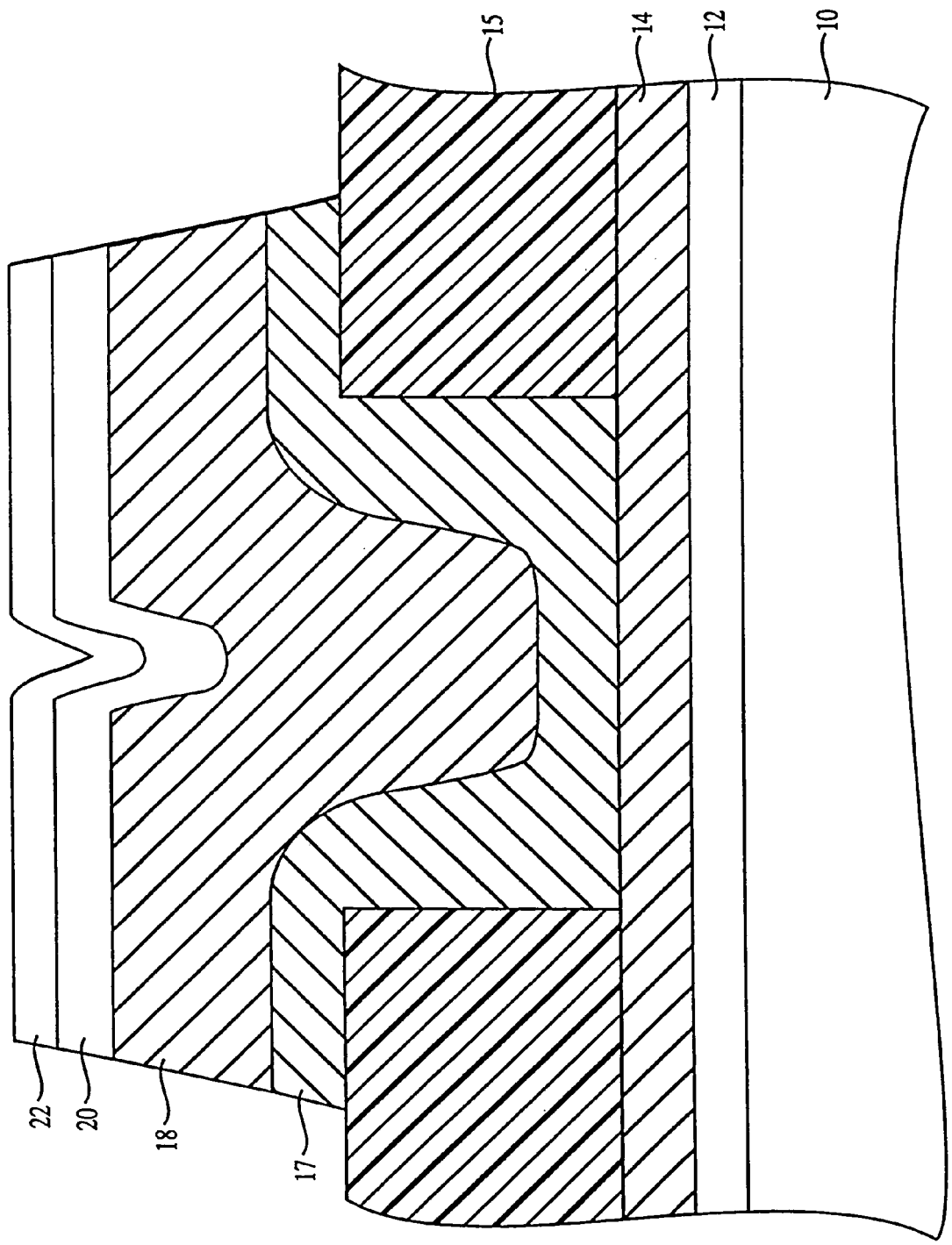

Referring now to FIG. 6, a second conductive electrode 22 is formed over the second glass layer 20. The second conductive electrode 22 may comprise any electrically conductive material, for example, tungsten, tantalum, titanium, conductive nitrides, or other materials. Thus, advantageously, the second glass layer 20 may be chosen to considerably slow or prevent migration of electrically conductive metals, such as silver, through the resistance variable memory element 100.

Figure 7:
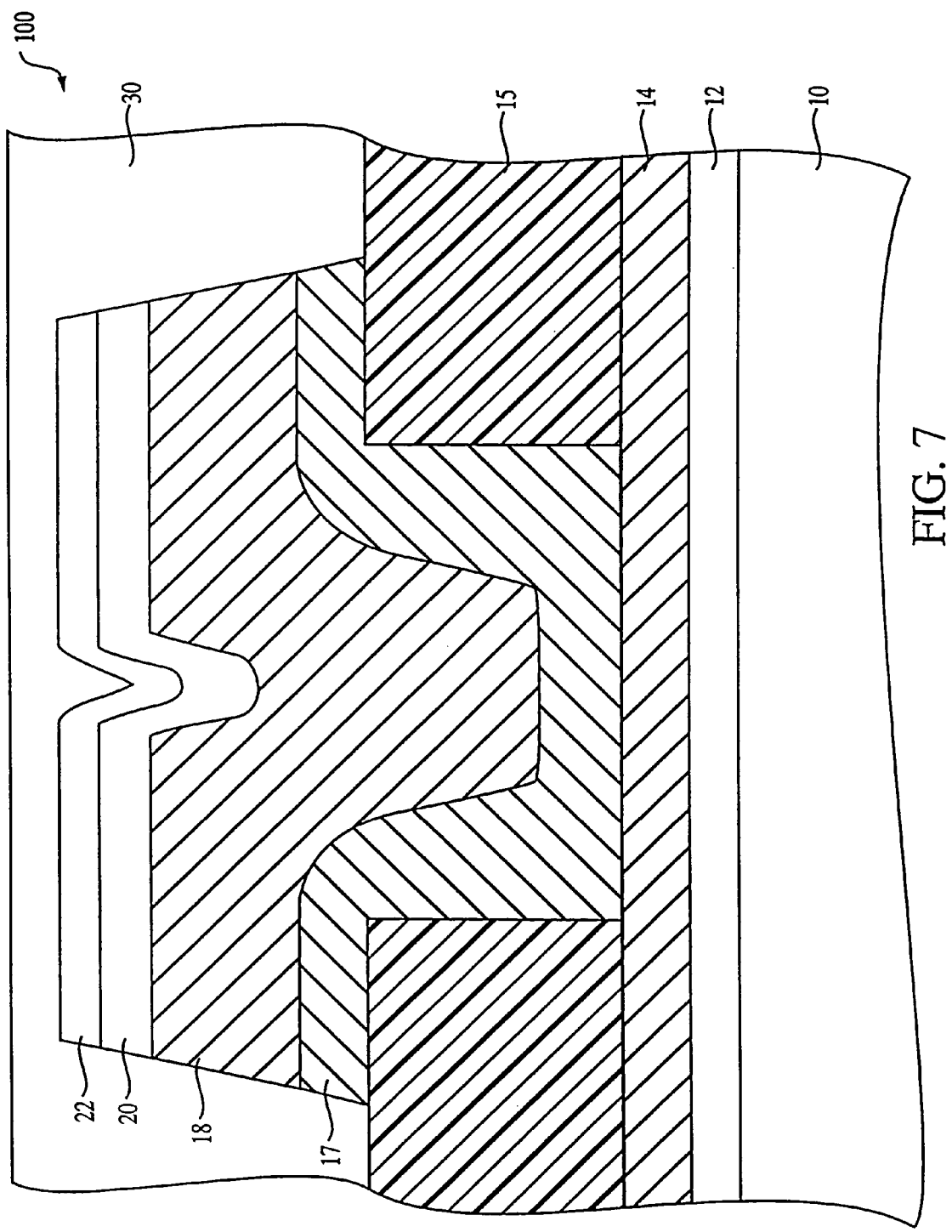

Referring now to FIG. 7, one or more additional insulating layers 30 may be formed over the second electrode 22 and the second insulating layer 15 to isolate the resistance variable memory element 100 from other structures fabricated over the substrate 10. Conventional processing steps can then be carried out to electrically couple the resistance variable memory element to various circuits of a memory array.

Figure 8:
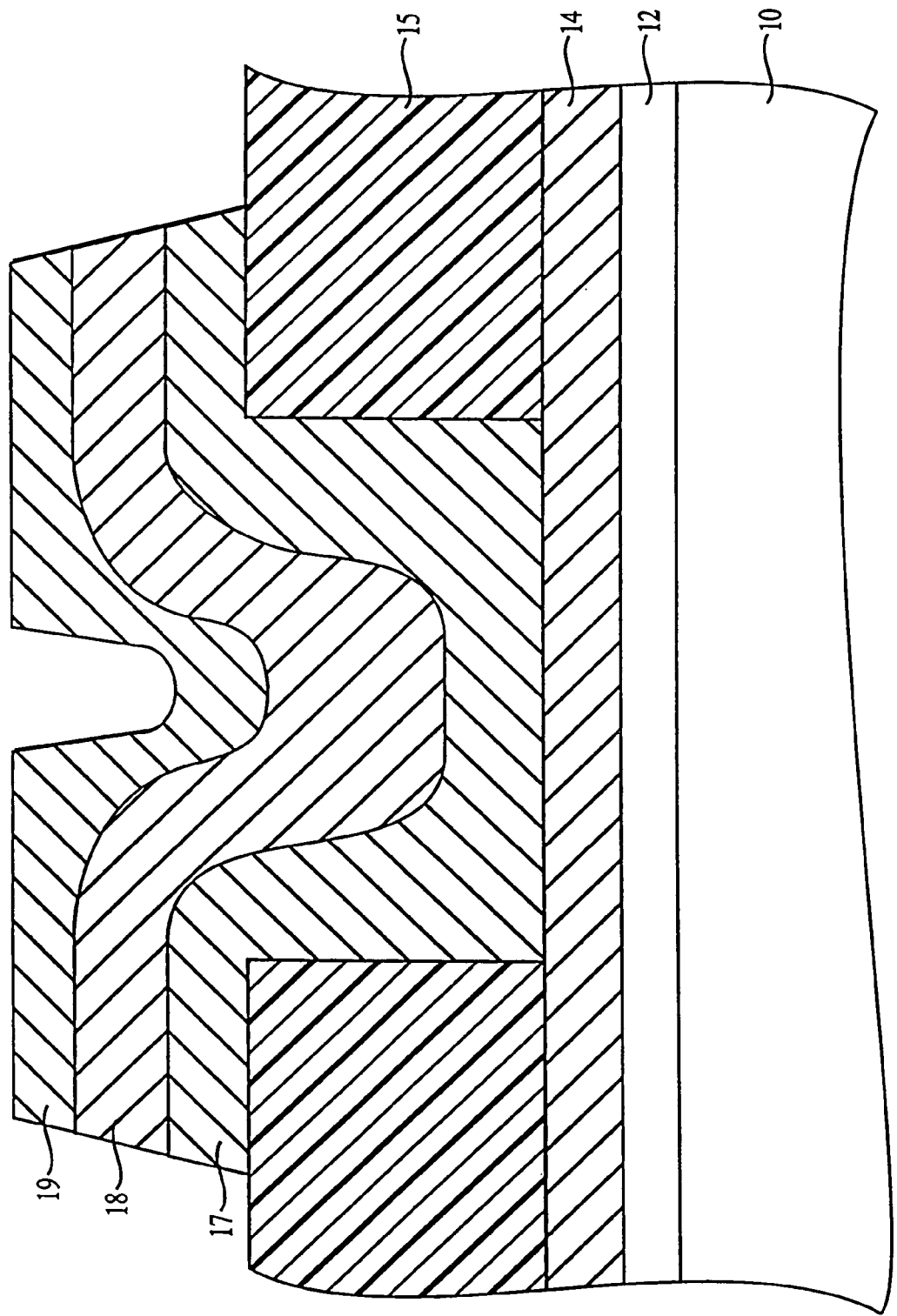
FIG. 8 illustrates a cross-sectional view of a memory element as shown in FIG. 1 at a stage of processing subsequent to that shown in FIG. 4.

In accordance with another embodiment of the invention, one or more layers of a metal containing material, such as silver-selenide, may be deposited over the first chalcogenide glass layer 17. A plurality of metal containing layers may be used. As shown in FIG. 8, an optional second silver-selenide layer 19 may be deposited on the first silver-selenide layer 18 subsequent to the processing step, which results in the structure shown in FIG. 4.

The thickness of the metal containing layers 18, 19 is such that the total thickness of these combined layers, e.g. silver-selenide layers, is greater than or equal to the thickness of the first chalcogenide glass layer 17. The total thickness of the combined metal containing layers 18, 19 is also greater than the thickness of a second glass layer 20. It is preferred that the total thickness of the combined metal containing layers 18, 19 is between about 1 to about 5 times greater than the thickness of the first chalcogenide glass layer 17 and accordingly between about 1 to about 5 times greater than the thickness of the second glass layer 20. It is even more preferred that the total thickness of the combined metal containing layers 18, 19 is between about 2 to about 3.3 times greater than the thicknesses of the first chalcogenide glass layer 17 and the second glass layer 20.

In accordance, with another embodiment of the invention, the first chalcogenide glass layer 17 may comprise a plurality of layers of a chalcogenide glass material, such as germanium-selenide. The second glass layer 20 may also comprise a plurality of layers of a glass material. Any suitable number of layers may be used to comprise the first chalcogenide glass layer 17 and/or the second glass layer 20. However it is to be understood that the total thickness of the metal containing layer(s) 18,19 should be thicker than the total thickness of the plurality of chalcogenide glass layers 17 and additionally the total thickness of the metal containing layer(s) 18, 19 should be thicker than the total thickness of the one or more layers of the second glass layer 20. Preferably a ratio of the total thickness of the metal containing layer(s) 18, 19 to the total thickness of the plurality of layers of chalcogenide glass 17 is between about 5:1 and about 1:1. Also, preferably a ratio of the total thickness of the metal containing layer(s) 18, 19 to the total thickness of the plurality of layers of the second glass layer 20 is between about 5:1 and about 1:1.

Referring now to FIG. 7, in accordance with another embodiment of the invention, one or more of the chalcogenide glass layers 17, 20 may also be doped with a dopant, such as a metal, preferably silver.

Figure 9:
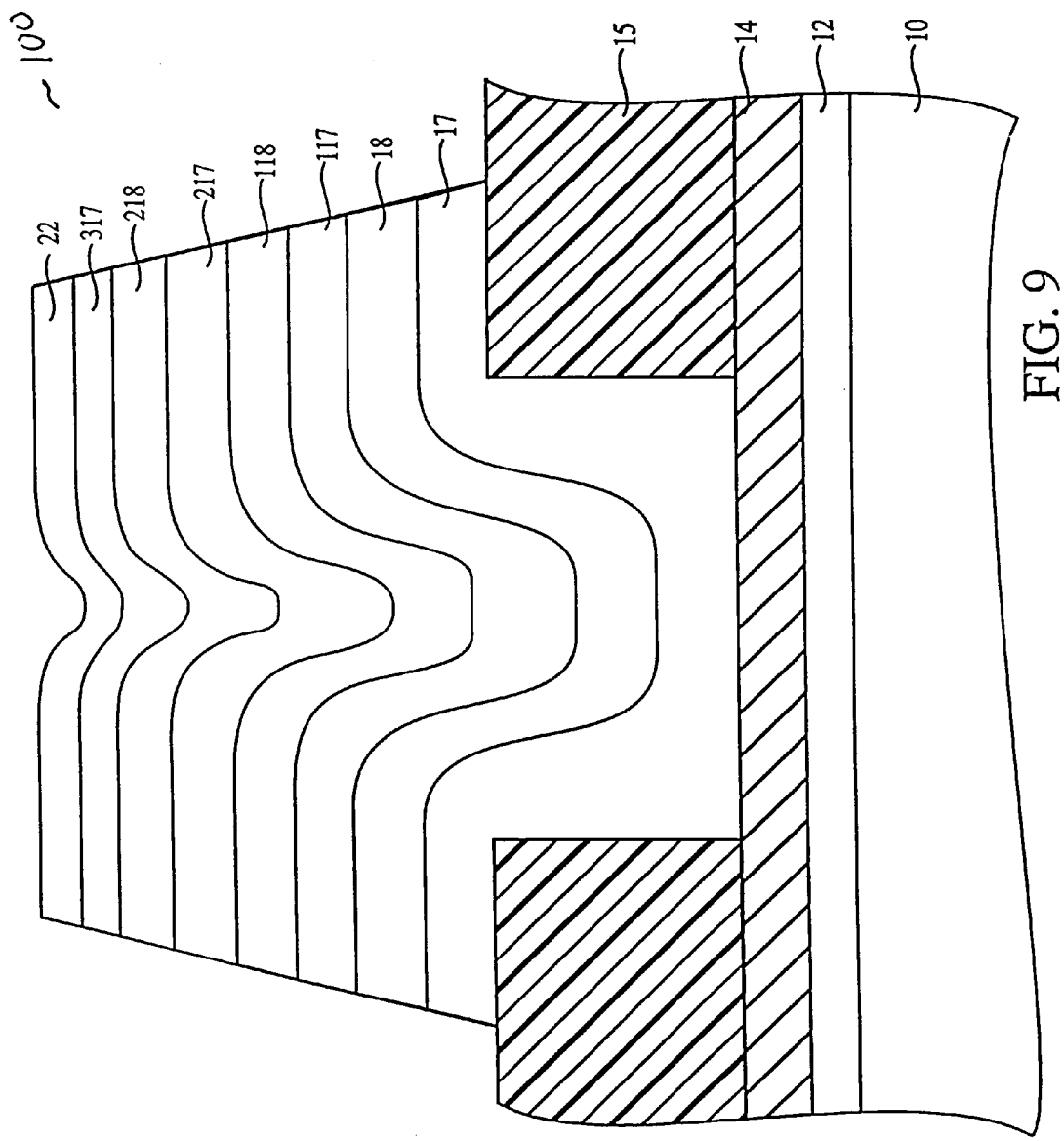
FIG. 9 illustrates a cross-sectional view of a memory element in accordance with an embodiment of the invention at a stage of processing subsequent to that shown in FIG. 4.

In accordance with another embodiment of the invention as illustrated in FIG. 9, which shows a stage of processing subsequent to that shown in FIG. 4, the stack of layers formed between the first and second electrodes may include alternating layers of chalcogenide glass 17, 117, 217, 317 and metal containing layers 18, 118, 218. A desirable metal containing layer is silver-selenide. As shown in FIG. 9, a first chalcogenide glass layer 17 is positioned over a first electrode 14, a first silver-selenide layer 18 is positioned over the first chalcogenide glass layer 17, a second chalcogenide glass layer 117 is positioned over the first silver-selenide layer 18, a second silver-selenide layer 118 is positioned over the second chalcogenide glass layer 117, a third chalcogenide glass layer 217 is positioned over the second silver-selenide layer 118, a third silver-selenide layer 218 is positioned over the third chalcogenide glass layer 217, and a fourth chalcogenide glass layer 317 is positioned over the third silver-selenide layer 218. The second conductive electrode 22 can be formed over the fourth chalcogenide glass layer 317.

In accordance with this same embodiment, the memory element 100 comprises at least two metal containing layers 18, 118 and at least three chalcogenide glass layers 17, 117, 217. However, it is to be understood that the memory element 100 may comprise a plurality of alternating layers of chalcogenide glass 17, 117, 217 and silver-selenide 18, 118, so long as the alternating layers start with a first chalcogenide glass layer, e.g 17, and end with a last chalcogenide glass layer, e.g. 317, with the first chalcogenide glass layer contacting a first electrode 14 and the last chalcogenide glass layer contacting a second electrode 22. The thickness and ratios of the alternating layers of silver-selenide 18, 118, 218 and chalcogenide glass 17, 117, 217, 317 are the same as described above, in that the silver-selenide layers 18, 118, 218 are preferably thicker than connecting chalcogenide glass layers 17, 117, 217, 317 in a ratio of between about 5:1 and about 1:1 silver-selenide layer 18, 118, 218 to connected chalcogenide glass layer 17, 117, 217, 317, and more preferably between about 3.3:1 and 2:1 silver-selenide layer 18, 118, 218 to connected chalcogenide glass layer 17, 117, 217, 317.

Figure 10:
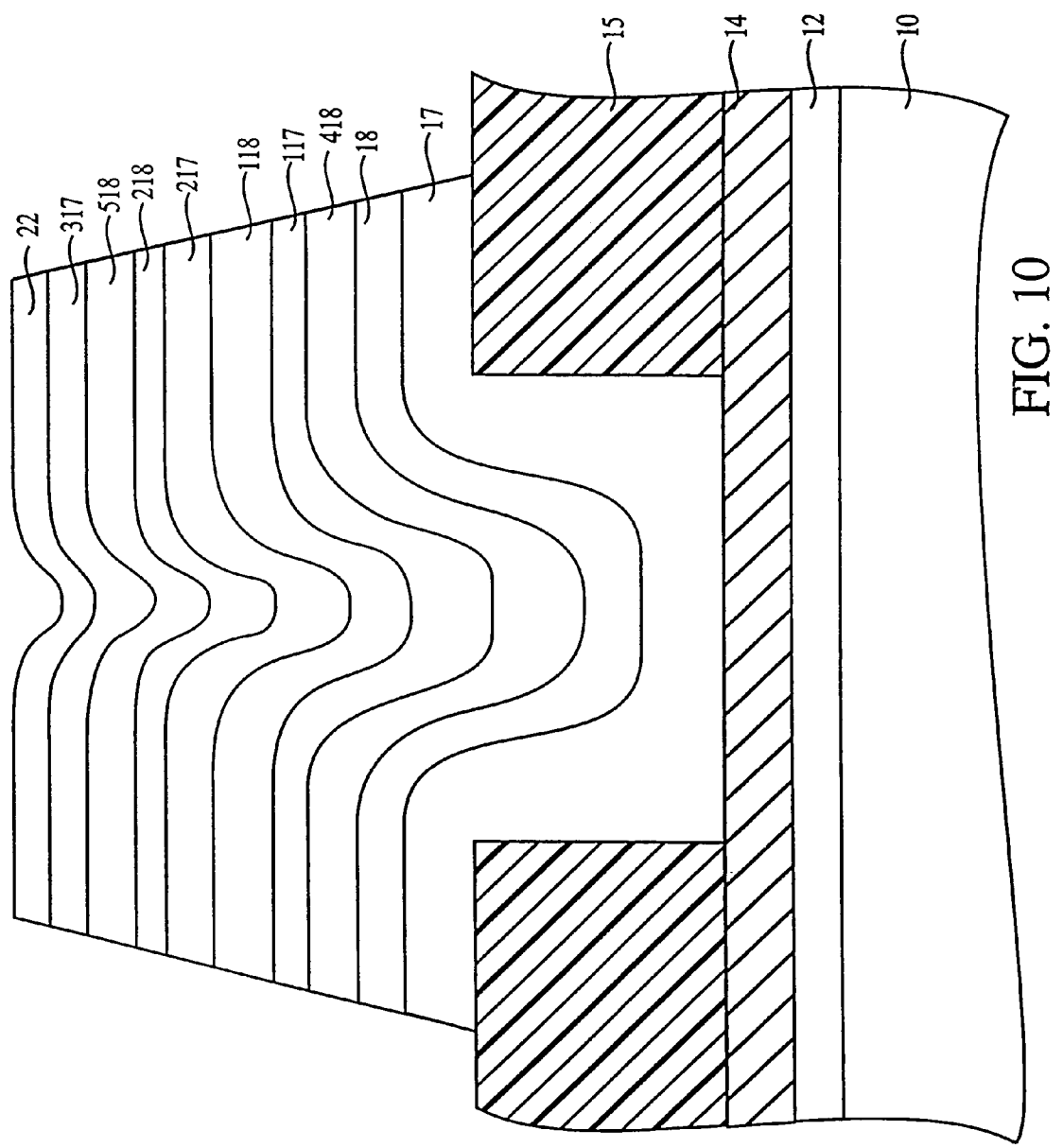
FIG. 10 illustrates a cross-sectional view of a memory element in accordance with an embodiment of the invention at a stage of processing subsequent to that shown in FIG. 4.

As shown in FIG. 10, in another embodiment of the invention, one or more layers of a metal containing material

18, 418, such as silver-selenide, may be deposited between the chalcogenide glass layers 17, 117. A plurality of silver-selenide layers 18, 418 may be used. Thus, as shown in FIG. 10, at a processing step subsequent to that shown in FIG. 4, an additional silver-selenide layer 418 may be deposited on the first silver-selenide layer 18 and an additional silver-selenide layer 518 may be deposited on the third silver-selenide layer 218.

In accordance with another embodiment of the invention, each of the chalcogenide glass layers 17, 117, 217, 317 shown in FIG. 10 may comprise a plurality of thinner layers of a chalcogenide glass material, such as germanium-selenide. Any suitable number of layers may be used to comprise the chalcogenide glass layers 17, 117, 217, 317.

In another embodiment of the invention, one or more of the chalcogenide glass layers 17, 117, 217, 317 may also be doped with a dopant such as a metal, which is preferably silver. It should be noted that when a chalcogenide glass layer, such as layer 117, is sputter deposited over a silver selenide layer, such as layer 418, the energetic nature of the sputtering process may cause a small amount of Ag to be incorporated into the chalcogenide glass layer.

Devices constructed according to the embodiments of the invention, particularly those having a silver-selenide layer (e.g. layer 18) disposed between two chalcogenide glass layers (e.g. layers 17, 20) show improved memory retention and write/erase performance over conventional memory devices. These devices have also shown data retention for more than 1200 hours at room temperature. The devices switch at pulse widths less than 2 nanoseconds compared with doped resistance variable memory elements of the prior art that switch at about 100 nanosecond pulses.

Figure 11:
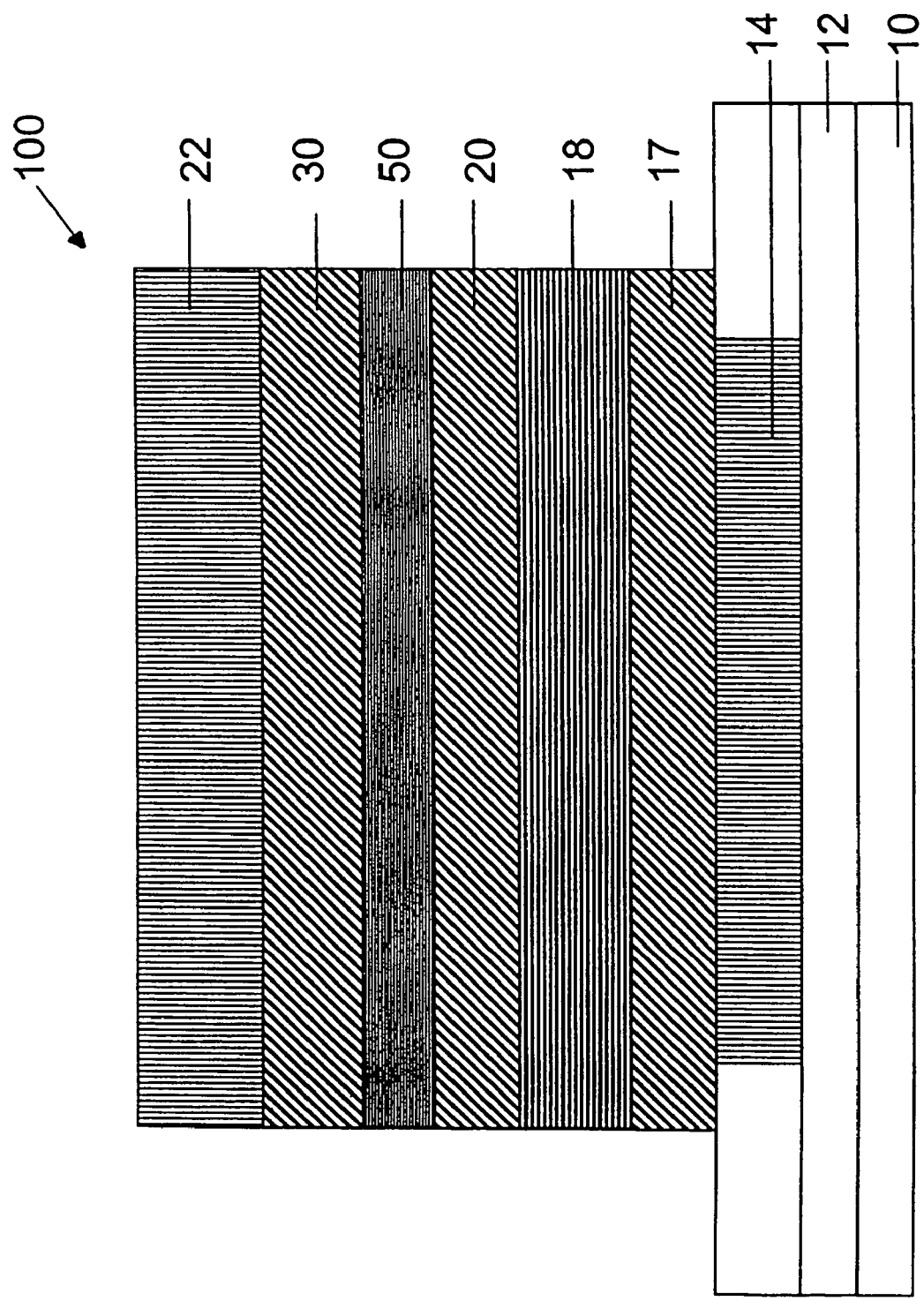
FIG. 11 illustrates a cross-sectional view of a memory element in accordance with an embodiment of the invention.

As shown in FIG. 11, in accordance with another embodiment of the present invention and similar to the first exemplary embodiment, a silver layer 50 is provided above the second chalcogenide glass layer 20. A conductive adhesion layer 30 is then provided over the silver layer 50 and a top electrode 22 is provided over the conductive adhesion layer 30. The silver layer 50 may be deposited over the second glass layer 20 by any suitable means, such as sputtering or plating techniques, including electroplating or electroless plating. The desired thickness of the silver layer is about 200 Å. Suitable materials for the conductive adhesion layer include conductive materials capable of providing good adhesion between the silver layer 50 and the top electrode layer 22. Desirable materials for the conductive adhesion layer 30 include chalcogenide glasses. A top electrode 22 is then formed over the conductive adhesion layer 30.

The chalcogenide glass layers 17, 20 of this exemplary embodiment can be germanium-selenide glass having a $Ge_xSe_{100-x}$ stoichiometry, where x ranges from 17 to 43. The preferred stoichiometries are about $Ge_{20}Se_{80}$ to about $Ge_{43}Se_{57}$, most preferably about $Ge_{40}Se_{60}$. When the glass is undoped, the first and second chalcogenide glass layers 17, 20 preferably have a thickness from about 100 Å to about 1000 Å and more preferably about 150 Å.

The metal containing layer 18 can be any suitable metal containing material. For instance, suitable metal containing layers 18 include silver-chalcogenide layers such as silver-selenide, silver-sulfide, silver-oxide, and silver-telluride among others. A desirable metal containing layer is silver-selenide. A variety of processes can be used to form the silver-selenide metal containing layer 18. For instance, physical vapor deposition techniques such as evaporative deposition and sputtering may be used. Other processes such as chemical vapor deposition, co-evaporation or depositing a layer of selenium above a layer of silver to form silver-selenide can also be used. The metal containing layer 18 can be about 1 to 5 times greater than the thickness of the first and second chalcogenide glass layers 17, 20 and is preferably about 470 Å.

The top and bottom electrodes, 22, 14 can be any conductive material, such as tungsten, tantalum, aluminum, platinum, silver, conductive nitrides, and others. The bottom electrode 14 is preferably tungsten. The top electrode 22 is preferably tungsten or tantalum nitride.

The conductive adhesion layer 30 may be the same chalcogenide glass material used in the first and second chalcogenide glass layers 17, 20 discussed above. In this case, the conductive adhesion layer 30 can be formed by sputtering the chalcogenide glass onto the silver layer 50. Just as silver is incorporated into a chalcogenide glass layer when sputter deposited over a silver selenide layer as described above, the energetic nature of the sputtering process may cause a small amount of silver from the silver layer 50 to be incorporated into the chalcogenide glass adhesion layer 30. Thus, the top electrode shorts to the chalcogenide glass adhesion layer 30, creating a conductive path from the top electrode to the first glass layer 17. The desired thickness of a chalcogenide glass conductive adhesion layer 30 is about 100 Å.

Use of a conductive adhesion layer 30 between the silver layer 50 and the top electrode 22 can prevent peeling of the top electrode 22 material during subsequent processing steps such as photoresist stripping. Electrode 22 materials, including tungsten, tantalum, tantalum-nitride, and titanium, among others, may not adhere well to silver layers 50 such as that shown in FIG. 11. For example, adhesion between the two layers 50, 22 may be insufficient to prevent the electrode 22 layer from at least partially separating (peeling) away from the underlying silver layer 50 and thus loosing electrical contact with the underlying layers 20, 18, 17, 14 of the memory element 100. Poor contact between the top electrode 22 and the underlying memory element layers 20, 18, 17, 14 can lead to electrical performance problems and unreliable switching characteristics. Use of a conductive binding layer 30 can substantially eliminate this problem.

As discussed above, use of metal containing layers 18, such as silver-selenide, in contact with a chalcogenide glass layer 17 may eliminate the need to dope the chalcogenide glass layer 17 with a metal during formation of the memory element 100. In accordance with the last-discussed embodiment, the silver selenide layer 18 provides a source of silver selenide, which is driven into chalcogenide glass layer 17 by a conditioning step after formation of the memory element 100 (FIG. 11). Specifically, the conditioning step comprises applying a potential across the memory element structure 100 such that silver selenide from the silver selenide layer 18 is driven into the first chalcogenide glass layers 17, forming a conducting channel. Movement of $Ag^+$ ions into or out of that channel causes an overall resistance change for the memory element 100. The pulse width and amplitude are critical parameters of the conditioning potential, which generally has a longer pulse width and higher amplitude than a typical potential used to program the memory element. After the conditioning step, the memory element 100 may be programmed, provide that some silver moved into the conductive channel during conditioning.

When silver is sputtered directly onto silver-selenide, agglomeration of silver at the silver layer 50/silver-selenide layer 18 interface may occur during deposition. Such silver agglomeration can cause subsequent processing problems during operation of the memory cell 100. Use of a chalcogenide glass layer 20 between the silver layer 50 and the silver-selenide layer 18 can prevent silver agglomeration on the surface of the silver-selenide layer 18.

Figure 12:
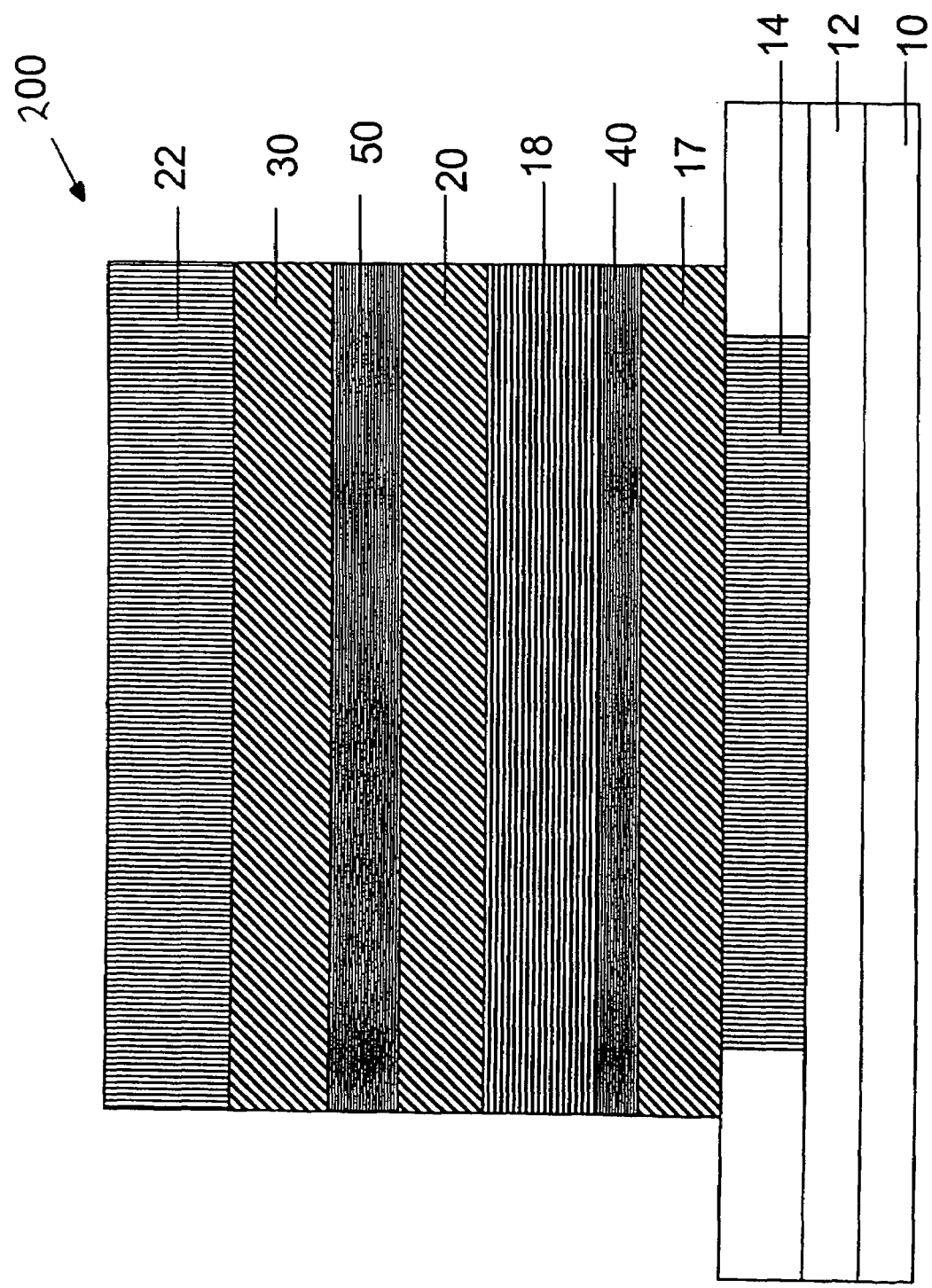
FIG. 12 illustrates a cross-sectional view of a memory element in accordance with another embodiment of the invention.

In another exemplary embodiment of the present invention, an additional silver layer 40 can be deposited between the lower chalcogenide glass layer 17 and the silver selenide glass layer 18, as shown in FIG. 12. Thus, a memory element 200, as illustrated in FIG. 12, comprises a first chalcogenide glass layer 17, a first silver layer 40, a silver-selenide glass layer 18, a second chalcogenide glass layer 20, a second silver layer 50', a conductive adhesion layer 30, and a top electrode layer 22. Addition of the first silver layer 40 minimizes the amplitude and pulse width of the conditioning potential needed prior to write and erase operations. Layers 17, 18, 20, 22, 50', and 30 can be of the same or similar materials as in other embodiments of the invention and can be formed by similar means. Furthermore, the first chalcogenide glass layer 17 may be a doped chalcogenide glass. For example, the first chalcogenide glass layer may be silver-doped silver selenide.

In accordance with this embodiment of the invention, a conditioning step allows silver selenide from the silver selenide layer 18 to be incorporated into the first chalcogenide glass layer 17. Deposition of the silver selenide layer 18 over the silver layer 40 causes the silver selenide layer 18 to become silver-rich. This silver-rich silver selenide more easily incorporates into the first chalcogenide glass layer 17 under the influence of an applied conditioning pulse. As a result, the conditioning pulse can have a shorter pulse width and lower amplitude, effectively speeding up the conditioning process.

The first silver layer 40 must be relatively thin in comparison to the second silver layer 50', in order to prevent an excess of silver from being incorporated into the lower chalcogenide layer during conditioning, which can shorten the life of the memory element. The first silver layer 40 has a desired thickness of about 35–50 Å when the first glass layer 17 is about 150 Å

Figure 13:
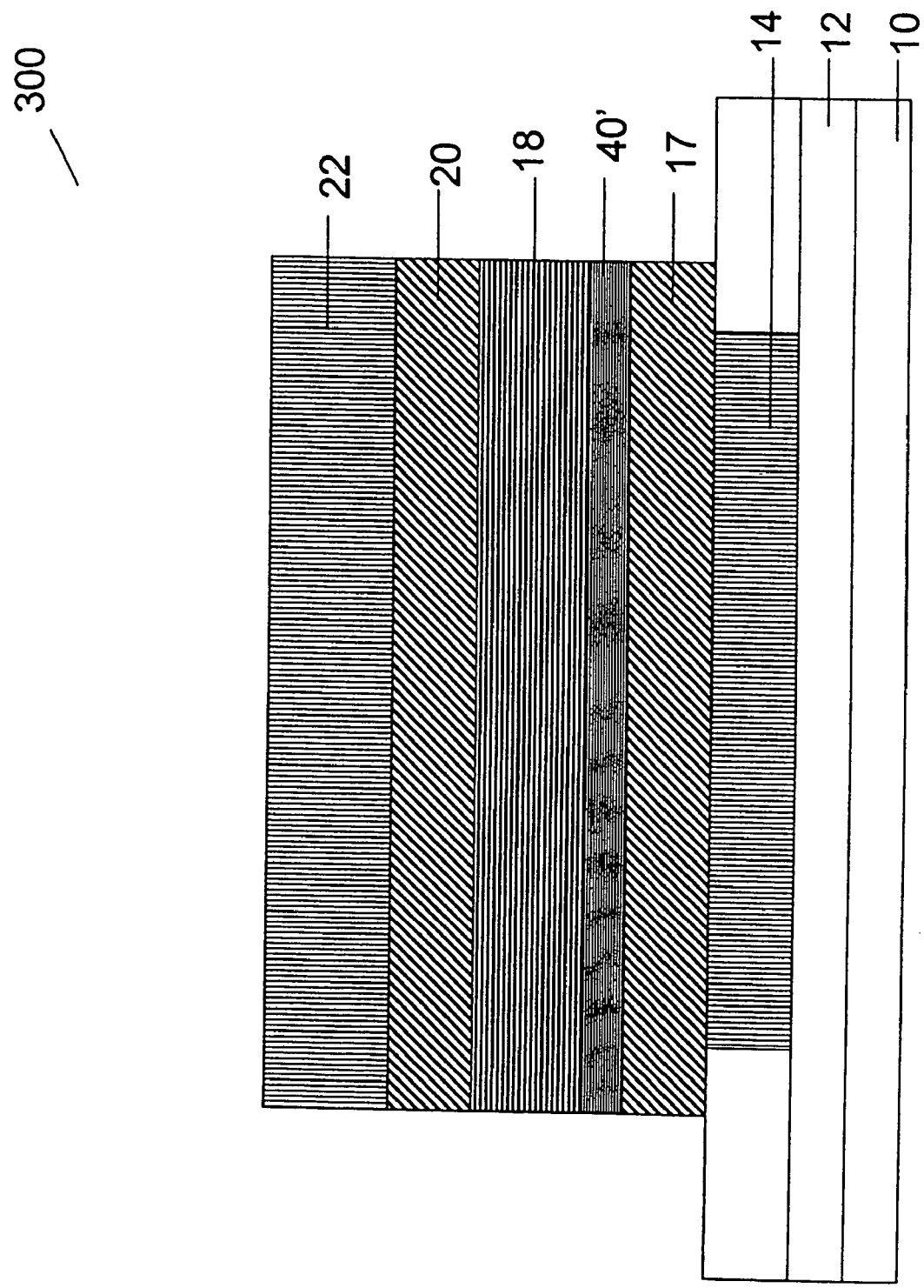
FIG. 13 illustrates a cross-sectional view of a memory element in accordance with another embodiment of the invention.

As shown in FIG. 13, in accordance with another embodiment of the present invention and similar to the first exemplary embodiment, a silver layer 40' is provided above a chalcogenide glass layer 17. Thus, a memory element 300, as illustrated in FIG. 13, comprises a first chalcogenide glass layer 17, a silver layer 40', a silver-selenide glass layer 18, a second chalcogenide glass layer 20, and a top electrode layer 22. In accordance with this embodiment of the invention, a conditioning step drives silver selenide from the silver selenide layer 18 into the first chalcogenide glass layer 17, opening a conductive channel.

Figure 14:
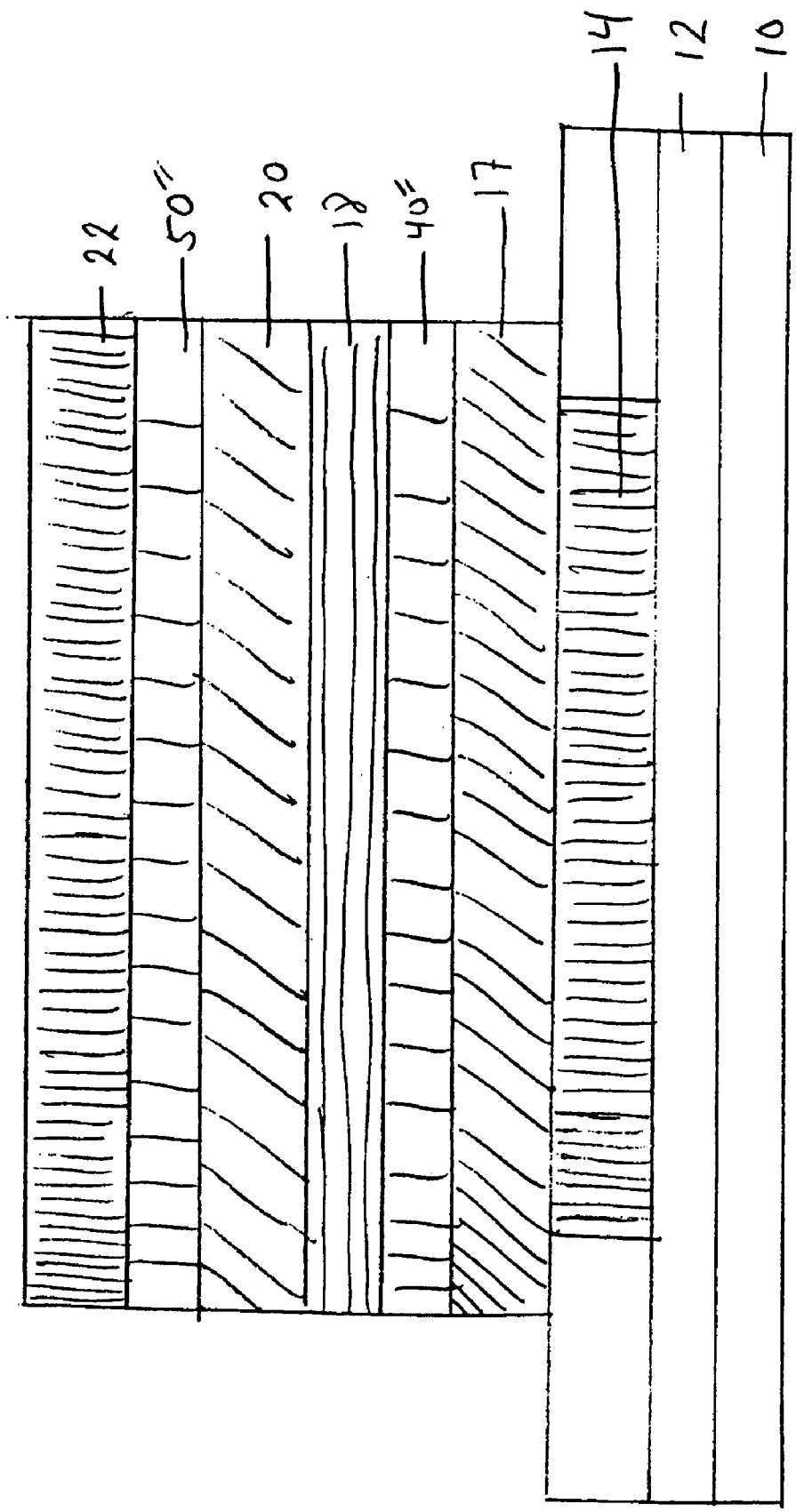
FIG. 14 illustrates a cross-sectional view of a memory element in accordance with another embodiment of the invention.

As shown in FIG. 14, in accordance with another embodiment of the present invention and similar to the embodiment shown in FIG. 13, a silver layer 50' is provided above the second glass layer 20. The silver layer 50' may be deposited over the second glass layer 20 by any suitable means, such as sputtering or plating techniques, including electroplating or electroless plating. The desired thickness of the silver layer is about 200 Å. A top electrode 22 is then formed over the silver layer 50'. Thus, a memory element 400, as illustrated in FIG. 14, comprises a first chalcogenide glass layer 17, a silver layer 40", a silver-selenide glass layer 18, a second chalcogenide glass layer 20, a second silver layer 50' and a top electrode layer 22. The first chalcogenide glass layer 17, may be a doped chalcogenide glass. For example, the first chalcogenide glass layer may be silver-doped silver selenide.

The embodiments described above refer to the formation of only a few possible resistance variable memory element 100 structures in accordance with the invention. It must be understood, however, that the invention contemplates the formation of other such resistance variable memory elements, which can be fabricated as a memory array and operated with memory element access circuits.

Figure 15:
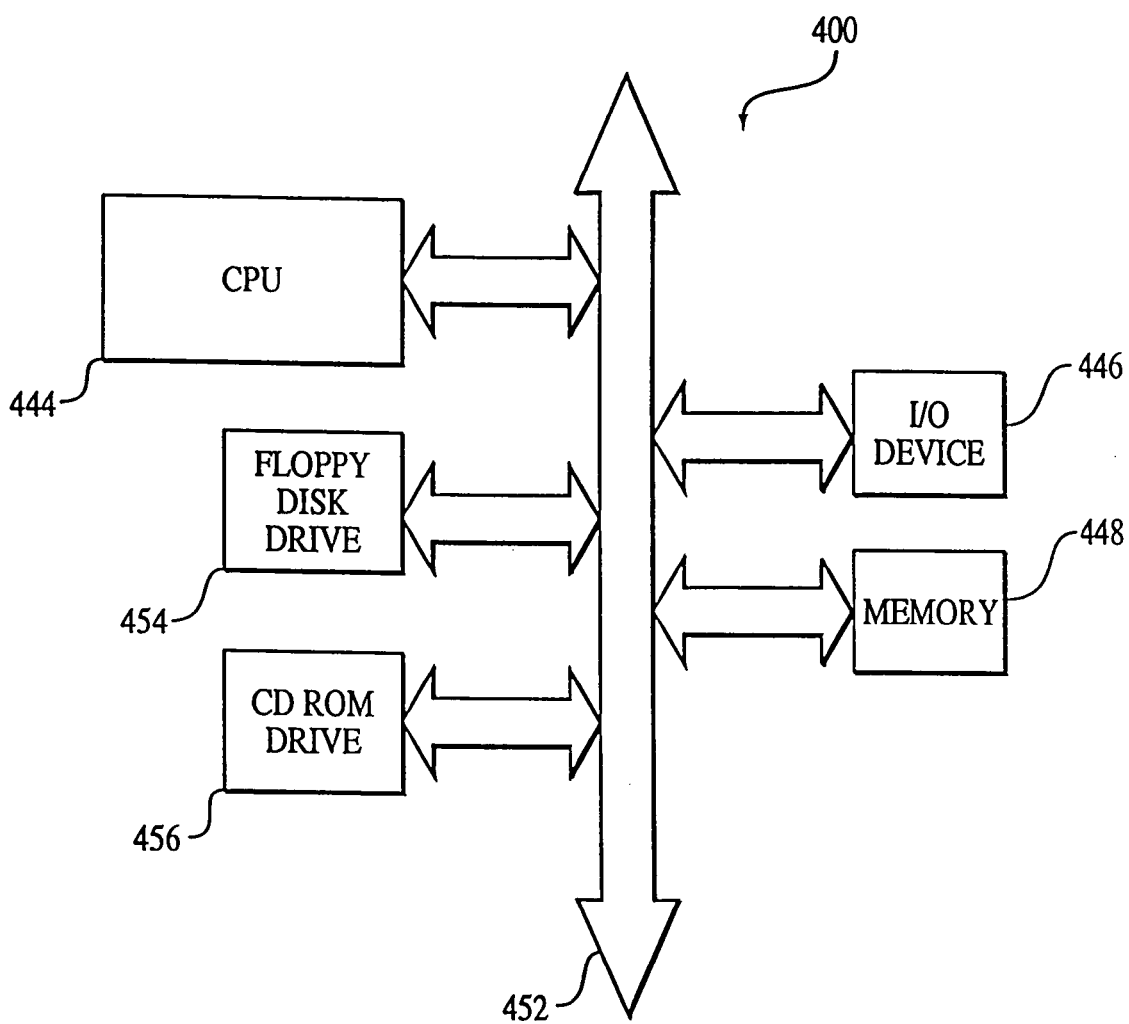
FIG. 15 illustrates a computer system having a memory element in accordance with the invention.

FIG. 15 illustrates a typical processor system 400 which includes a memory circuit 448, for example a programmable conductor RAM, which employs resistance variable memory elements fabricated in accordance with the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452 typically through a memory controller.

In the case of a computer system, the processor system may include peripheral devices such as a floppy disk drive 454 and a compact disc (CD) ROM drive 456, which also communicate with CPU 444 over the bus 452. Memory 448 is preferably constructed as an integrated circuit, which includes one or more resistance variable memory elements 100. If desired, the memory 448 may be combined with the processor, for example CPU 444, in a single integrated circuit.

The above description and drawings are only to be considered illustrative of exemplary embodiments which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A resistance variable memory element comprising:
   a first electrode;
   a first chalcogenide glass layer electrically coupled to said first electrode;
   a first metal layer over said first chalcogenide glass layer;
   a metal containing layer over said metal layer;
   a second chalcogenide glass layer over said metal containing layer;
   a second metal layer over and in contact with said second chalcogenide glass layer;
   a conductive adhesion layer over and in contact with said second metal layer; and
   a second electrode electrically coupled to said conductive adhesion layer.

2. The resistance variable memory element of claim 1, wherein said metal containing layer is a silver-chalcogenide layer.

3. The resistance variable memory element of claim 2, wherein said metal containing layer is silver-selenide.

4. The resistance variable memory element of claim 1, wherein said metal containing layer has a thickness of about 1 to 5 times the thickness of the first and second chalcogenide glass layers.

5. The resistance variable memory element of claim 1, wherein said metal containing layer has a thickness of about 470/.

6. The resistance variable memory element of claim 1, wherein said first metal layer and said second metal layer are silver.

7. The resistance variable memory element of claim 6, wherein said first silver layer has a thickness of about 35/ to about 50/.

8. The resistance variable memory element of claim 6, wherein said second silver layer has a thickness of about 200/.

9. The resistance variable memory element of claim 6, wherein said first chalcogenide glass layer and said second chalcogenide glass layer each have a thickness of about 100/ to about 1000/.

10. The resistance variable memory element of claim 1, wherein said first chalcogenide glass layer comprises silver-doped chalcogenide glass.

11. The resistance variable memory element of claim 1, wherein said first chalcogenide glass layer and said second chalcogenide glass layer each have a thickness of about 150/.

12. The resistance variable memory element of claim 1, wherein said first chalcogenide glass layer and said second chalcogenide glass layer comprise a material having a formula $Ge_xSe_{100-x}$, where x=17 to 43.

13. The resistance variable memory element of claim 1, wherein said first chalcogenide glass layer and said second chalcogenide glass layer comprise germanium selenide glass having a stoichiometry of about $Ge_{40}Se_{60}$.

14. The resistance variable memory element of claim 1, wherein said conductive adhesion layer is a chalcogenide glass layer.

15. The resistance variable memory element of claim 14, wherein said conductive adhesion layer is germanium selenide glass having a stoichiometry of about $Ge_{40}Se_{60}$.

16. The resistance variable memory element of claim 14, wherein said conductive adhesion layer has a thickness of about 100/.

17. The resistance variable memory element of claim 1, wherein said first and second electrodes are selected from the group consisting of tungsten, nickel, tantalum, aluminum, platinum, and conductive nitrides.

18. The resistance variable memory element of claim 17, wherein said first electrode is tungsten.

19. The resistance variable memory element of claim 17, wherein said second electrode is tantalum nitride.

20. A method of forming a resistance variable memory element comprising:
forming a first electrode;
forming a first chalcogenide glass layer;
forming a first metal layer electrically coupled to said first chalcogenide glass layer;
forming a metal containing layer over said metal layer;
forming a second chalcogenide glass layer over said metal containing layer;
forming a second metal layer over and in contact with said second chalcogenide glass layer;
forming a conductive adhesion layer over and in contact with said second metal layer; and
forming a second electrode electrically coupled to said conductive adhesion layer.

21. The method of claim 20, wherein said metal containing layer is a silver-chalcogenide layer.

22. The method of claim 21, wherein said metal containing layer is silver-selenide.

23. The method of claim 20, wherein said metal containing layer has a thickness of about 1 to 5 times the thickness of the first and second chalcogenide glass layers.

24. The method of claim 20, wherein said metal containing layer has a thickness of about 470/.

25. The method of claim 20, wherein said first and second metal layers are silver.

26. The method of claim 25, wherein said first silver layer has a thickness of about 35/ to about 50/.

27. The method of claim 25, wherein said second silver layer has a thickness of about 200/.

28. The method of claim 20, wherein said first chalcogenide glass layer and said second chalcogenide glass layer each have a thickness of about 100/ to about 1000/.

29. The method of claim 28, wherein said first chalcogenide glass layer and said second chalcogenide glass layer each have a thickness of about 150/.

30. The method of claim 20, wherein said first chalcogenide glass layer and said second chalcogenide glass layer comprise a material having a formula $Ge_xSe_{100-x}$, where x=17 to 43.

31. The method of claim 20, wherein said first chalcogenide glass layer and said second chalcogenide glass layer comprise germanium selenide glass having a stoichiometry of about $Ge_{40}Se_{60}$.

32. The method of claim 20, wherein said conductive adhesion layer is a chalcogenide glass layer.

33. The resistance variable memory element of claim 32, wherein said conductive adhesion layer is germanium selenide glass having a stoichiometry of about $Ge_{40}Se_{60}$.

34. The method of claim 33, wherein said conductive adhesion layer has a thickness of about 100/.

35. The method of claim 33, further comprising the step of applying a conditioning potential across the memory element structure.

36. The method of claim 34, wherein the pulse width of said conditioning potential ranges from about 100 nanoseconds to about 500 nanoseconds.

37. A resistance variable memory element comprising:
a first electrode;
a first chalcogenide glass layer electrically coupled to said first electrode;
a second chalcogenide glass layer over said first chalcogenide glass layer;
a metal containing layer between said first and second chalcogenide glass layers, said metal containing layer having a different composition than said first and second chalcogenide glass layers;
a first metal layer between said first chalcogenide glass layer and said metal containing layer;
a second metal layer over and in contact with said second chalcogenide glass layer;
a third chalcogenide glass layer over and in contact with said second metal layer; and
a second electrode electrically coupled to said third chalcogenide glass layer.

38. The resistance variable memory element of claim 27, wherein said metal containing layer is a silver-chalcogenide layer.

39. The resistance variable memory element of claim 38, wherein said metal containing layer is silver-selenide.

40. The resistance variable memory element of claim 37, wherein said metal containing layer has a thickness of about 1 to 5 times the thickness of the first and second chalcogenide glass layers.

41. The resistance variable memory element of claim 37, wherein said metal containing layer has a thickness of about 470/.

42. The resistance variable memory element of claim 37, wherein at least one of said first and second metal layers is silver.

43. The resistance variable memory element of claim 37, wherein said first chalcogenide glass layer and said second chalcogenide glass layer each have a thickness of about 100/ to about 1000/.

44. The resistance variable memory element of claim 37, wherein said first chalcogenide glass layer and said second chalcogenide glass layer comprise a material having a formula $Ge_xSe_{100-x}$, where x=17 to 43.

45. The resistance variable memory element of claim 37, wherein said first chalcogenide glass layer and said second chalcogenide glass layer comprise germanium selenide glass having a stoichiometry of about $Ge_{40}Se_{60}$.

46. The resistance variable memory element of claim 37, wherein said first and second electrodes are selected from the group consisting of tungsten, nickel, tantalum, aluminum, platinum, silver, and conductive nitrides.

47. The resistance variable memory element of claim 37, wherein said first chalcogenide glass layer comprises silver-doped chalcogenide glass.

48. A method of forming a resistance variable memory element comprising the steps of:
    forming a first electrode;
    forming a first chalcogenide glass layer electrically coupled to said first electrode;
    forming a second chalcogenide glass layer over said first chalcogenide glass layer;
    forming a metal containing layer between said first and second chalcogenide glass layers;
    forming a first metal layer between said first chalcogenide glass layer and said metal containing layer;
    forming a second metal layer over and in contact with said second chalcogenide glass layer;
    forming a third chalcogenide glass layer over and in contact with said second metal layer; and
    forming a top electrode electrically coupled to said third chalcogenide glass layer.

49. The method of claim 48, wherein said metal containing layer is a silver-chalcogenide layer.

50. The method of claim 48, wherein said metal containing layer is silver-selenide.

51. The method of claim 48, wherein said metal containing layer has a thickness of about 1 to 5 times the thickness of the first and second chalcogenide glass layers.

52. The method of claim 48, wherein said metal containing layer has a thickness of about 470/.

53. The method of claim 48, wherein at least one of said first and second metal layers is silver.

54. The method of claim 48, wherein said first chalcogenide glass layer and said second chalcogenide glass layer each have a thickness of about 100/ to about 1000/.

55. The method of claim 48, wherein said first chalcogenide glass layer and said second chalcogenide glass layer comprise a material having a formula $Ge_xSe_{100-x}$, where x =17 to 43.

56. The method of claim 55, wherein said first chalcogenide glass layer and said second chalcogenide glass layer comprise germanium selenide glass having a stoichiometry of about $Ge_{40}Se_{60}$.

57. The method of claim 48, further comprising the step of applying a conditioning potential across the memory element structure.

58. The method of claim 57, wherein the pulse width of said conditioning potential ranges from about 100 nanoseconds to about 500 nanoseconds.

* * * * *